United States Patent
Zhang (10) Patent No.: US 9,324,671 B2
(45) Date of Patent: Apr. 26, 2016

(54) METAL PILLAR BUMP PACKAGING STRCTURES AND FABRICATION METHODS THEREOF

(71) Applicant: Semiconductor Manufacturing International (Shanghai) Corporation, Shanghai (CN)

(72) Inventor: Guowei Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/660,376

(22) Filed: Mar. 17, 2015

(65) Prior Publication Data

US 2015/0279795 A1  Oct. 1, 2015

(30) Foreign Application Priority Data

Mar. 25, 2014  (CN) .......................... 2014 1 0114630

(51) Int. Cl.
*H01L 21/44* (2006.01)
*H01L 29/40* (2006.01)
*H01L 23/00* (2006.01)

(52) U.S. Cl.
CPC ................ *H01L 24/13* (2013.01); *H01L 24/11* (2013.01); *H01L 24/02* (2013.01); *H01L 24/03* (2013.01); *H01L 24/05* (2013.01); *H01L 2224/024* (2013.01); *H01L 2224/0231* (2013.01); *H01L 2224/0237* (2013.01); *H01L 2224/039* (2013.01); *H01L 2224/0345* (2013.01); *H01L 2224/0347* (2013.01); *H01L 2224/0391* (2013.01); *H01L 2224/03462* (2013.01); *H01L 2224/0401* (2013.01); *H01L 2224/05567* (2013.01); *H01L 2224/05624* (2013.01); *H01L 2224/05644* (2013.01); *H01L 2224/05647* (2013.01); *H01L2224/119* (2013.01); *H01L 2224/1145* (2013.01); *H01L 2224/11452* (2013.01);

(Continued)

(58) Field of Classification Search
CPC ......... H01L 24/10; H01L 24/11; H01L 24/12; H01L 24/13; H01L 24/16; H01L 24/28; H01L 24/03; H01L 24/05; H01L 2224/0231; H01L 2224/0237; H01L 2224/0401; H01L 2224/11462; H01L 2224/11622; H01L 2224/1302; H01L 2224/13016
USPC .......... 257/737, 738, E23.021, E23.069, 780, 257/E23.068; 438/612–617
See application file for complete search history.

(56) References Cited

U.S. PATENT DOCUMENTS

| 2007/0108612 A1* | 5/2007 | Hsieh | H01L 24/11 257/738 |
| 2007/0170556 A1* | 7/2007 | Chung | H01L 24/10 257/666 |
| 2014/0329382 A1* | 11/2014 | Hwang | H01L 24/11 438/614 |

*Primary Examiner* — Jasmine Clark
(74) *Attorney, Agent, or Firm* — Anova Law Group, PLLC

(57) ABSTRACT

A method for fabrication a metal pillar bump packaging structure is provided. The method includes providing a semiconductor substrate; and forming a metal interconnect structure and a dielectric layer exposing a portion of the metal interconnect structure on the semiconductor substrate. The method also includes forming a photoresist layer having an opening with an undercut with a bottom area greater than a top area at the bottom of the opening to expose the metal interconnect structure and a portion of the dielectric layer on the semiconductor substrate; and forming a metal pillar bump structure having a pillar body and an extension part with an enlarged bottom area in the opening and the undercut. Further, the method includes forming a soldering ball on the metal pillar bump structure.

19 Claims, 6 Drawing Sheets

(52) U.S. Cl.
CPC ............... *H01L 2224/11462* (2013.01); *H01L 2224/11472* (2013.01); *H01L 2224/11622* (2013.01); *H01L 2224/13006* (2013.01); *H01L 2224/13012* (2013.01); *H01L 2224/13016* (2013.01); *H01L 2224/13017* (2013.01); *H01L 2224/13018* (2013.01); *H01L 2224/13124* (2013.01); *H01L 2224/13144* (2013.01); *H01L 2224/13147* (2013.01); *H01L 2224/9212* (2013.01); *H01L 2924/05042* (2013.01); *H01L 2924/20103* (2013.01); *H01L 2924/20104* (2013.01)

METAL PILLAR BUMP PACKAGING STRCTURES AND FABRICATION METHODS THEREOF

CROSS-REFERENCES TO RELATED APPLICATIONS

This application claims the priority of Chinese patent application No. 201410114630.1, filed on Mar. 25, 2014, the entirety of which is incorporated herein by reference.

FIELD OF THE INVENTION

The present invention generally relates to the field of semiconductor manufacturing and, more particularly, relates to metal pillar bump packaging structures and fabrication processes thereof.

BACKGROUND

In a wafer-level chip packaging structure, the integrated devices, such as transistors, etc., are formed on semiconductor substrate firstly; and then metal interconnect structures are formed on the integrated devices. Further, soldering pads are formed on the metal interconnect structures to electrically connect with the metal interconnect structure. Further, soldering balls are formed on the soldering pads to electrically connect the integrated devices with a printed circuit board (PCB), or electrically connect the packaging structures of a plurality of other chips.

In a practical fabrication process, when a packaging structure is connected with a PCB and/or another packaging structure, in order to avoid a short circuit between adjacent soldering pads caused by the melting of soldering balls, it requires that the adjacent soldering pads should have a certain distance. Such a distance may reduce the density of the soldering pads, and the device density on the substrate is reduced as well. In order to solve the low device density problem, a metal pillar technology has been developed. The metal pillar technology refers to a technology that forms metal pillar bump structures, i.e., metal pillars with a relatively large thickness, on the soldering pads. The metal pillar bump structures extend the distance between corresponding soldering pads on the chip packaging structures; and/or the distance between pins of the PCB and the soldering pads on the chip packaging structures. Thus, when the soldering balls are melted, the liquid soldering balls may not flow onto the adjacent soldering pads to cause a short circuit. By using metal pillar bump structures, the device density on the substrate may be increased.

However, the thickness of the meal pill bump structures is relatively large; and the relatively large thickness of the pillar bump structures may cause the pillar bump structures to have a significantly large stress. When high temperature processes are used in the fabrication and packaging of the chips, the stress in the pillar bump structures may cause the dielectric layer on the semiconductor substrate to break, thus the reliability of the chip packaging structures may be relatively low; and the devices may fail. In order to solve the stress problem, a polyimide layer may be formed on the soldering pads to be used as a stress buffer layer, but a polyimide etching process has to be used, thus the production cost and the packaging time are increased. The disclosed methods and structures are directed to solve one or more problems set forth above and other problems.

BRIEF SUMMARY OF THE DISCLOSURE

One aspect of the present disclosure includes method for forming a metal pillar bump packaging structure. The method includes providing a semiconductor substrate; and forming a metal interconnect structure and a dielectric layer exposing a portion of the metal interconnect structure on the semiconductor substrate. The method also includes forming a photoresist layer having an opening with an undercut with a bottom area greater than a top area at the bottom of the opening to expose the metal interconnect structure and a portion of the dielectric layer on the semiconductor substrate; and forming a metal pillar bump structure having a pillar body and an extension part with an enlarged bottom area in the opening and the undercut. Further, the method includes forming a soldering ball on the metal pillar bump structure.

Another aspect of the present disclosure includes a metal pillar bump packaging structure. The metal pillar bump packaging structure includes a semiconductor substrate; and a metal interconnect structure formed on the semiconductor substrate. The metal pillar bump packaging structure also includes a dielectric layer exposing a portion of the metal interconnect structure formed on the metal interconnect structure and a metal pillar bump structure having a pillar body and an extension part with an enlarged bottom area formed on the portion of the metal interconnect structure exposed by the dielectric layer. Further, the metal pillar bump packaging structure includes a soldering ball formed on the top of the metal pillar bump structure Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
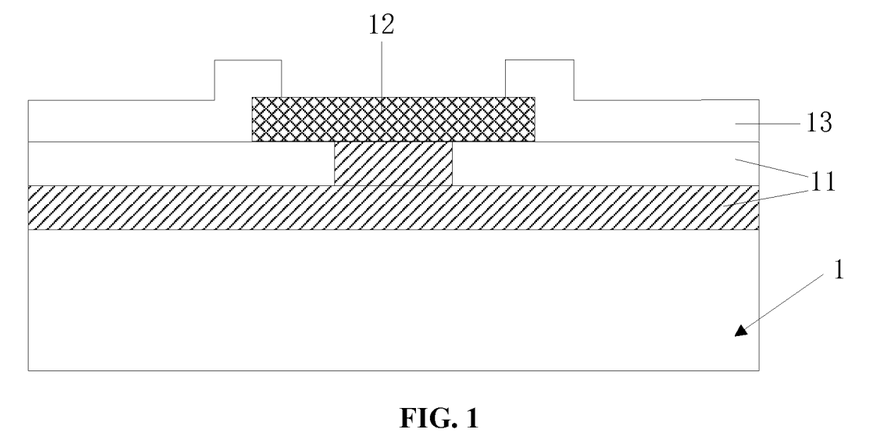
FIGS. 1~2 illustrate structures corresponding to certain stages of an exemplary fabrication process of a metal pillar bump packaging structure consistent with the disclosed embodiments.
Figure 2:
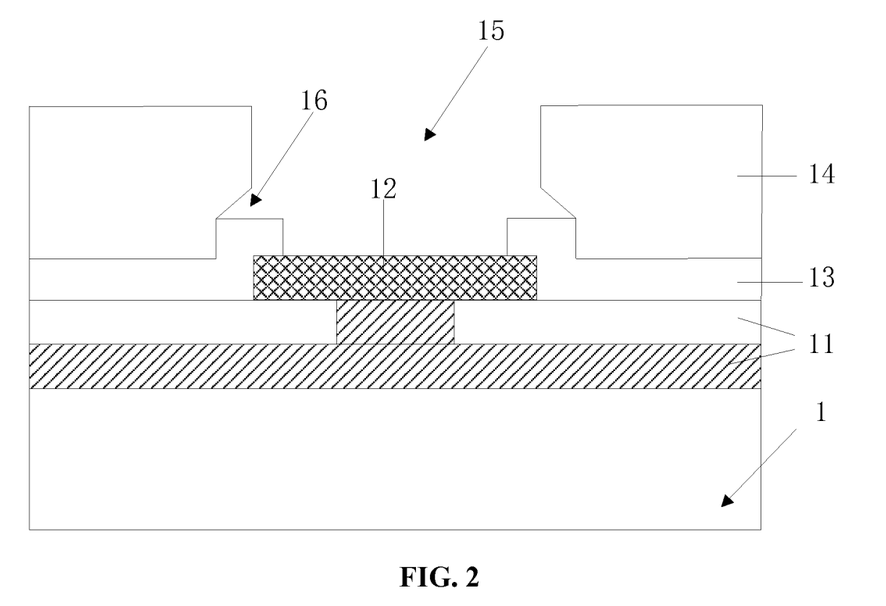
Figure 3:
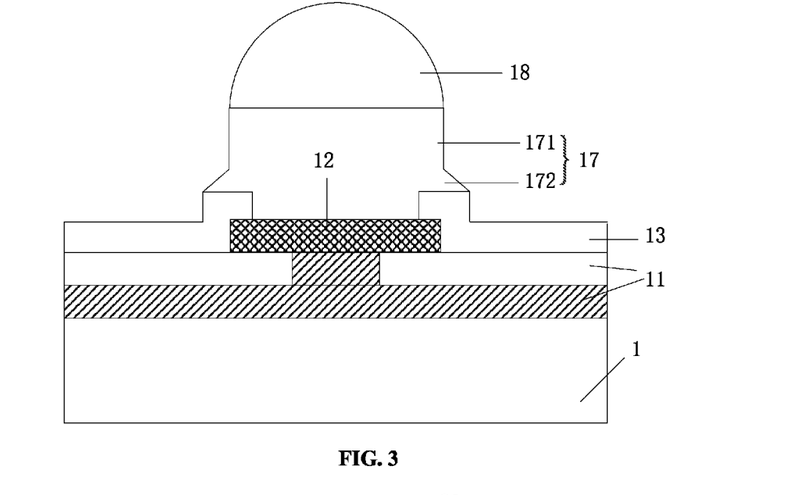
FIG. 3 illustrates a metal pillar bump packaging structure consistent with the disclosed embodiments.
Figure 7:
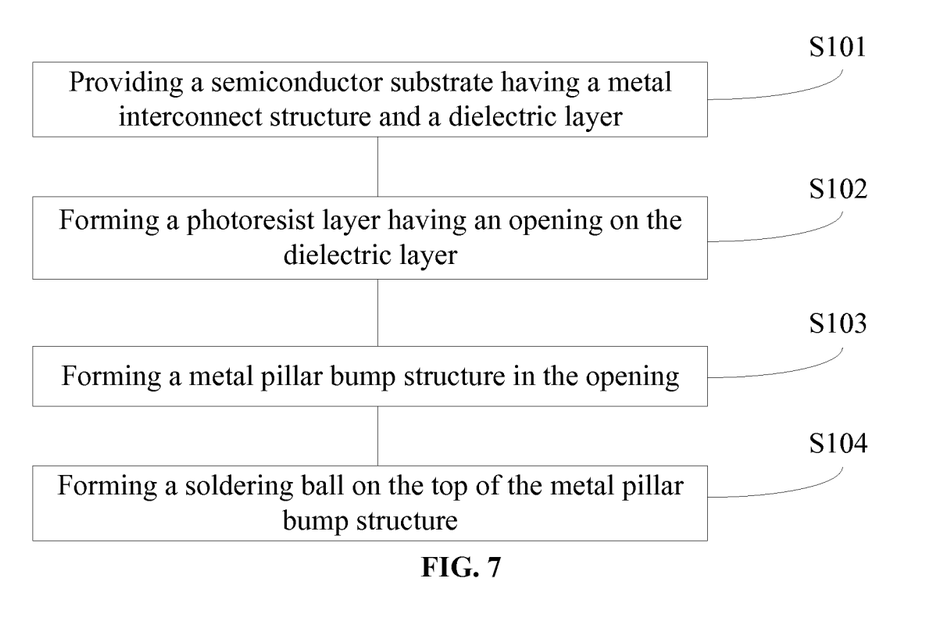
FIG. 7 illustrates an exemplary fabrication process of a metal pillar bump packaging structure consistent with the disclosed embodiments.

FIG. 7 illustrates an exemplary fabrication process of a metal pillar bump packaging structure consistent with the disclosed embodiments; and FIGS. 1~3 illustrate structures corresponding to certain stages of the exemplary fabrication process consistent with the disclosed embodiments.

As shown in FIG. 7, at the beginning of the fabrication process, a semiconductor substrate with certain structures is provided (S101). FIG. 1 illustrates a corresponding structure.

As shown in FIG. 1, a semiconductor substrate 1 is provided. The semiconductor substrate 1 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. The substrate 1 provides a base for subsequent processes and structures.

Various devices (not shown) may be formed in and/or on the semiconductor substrate 1, such as transistors, MEMS devices, or resistors, etc. In one embodiment, the devices are transistors.

Further, a first metal interconnect structure 11 may be formed on the surface of semiconductor substrate 1. The first metal interconnect structure 11 may be configured to electrically connect the devices formed in and/or on the semiconductor substrate 1 with other devices and/or structures. The first metal interconnect structure 11 may be formed by any appropriate process.

Further, as shown in FIG. 1, a soldering pad 12 and a dielectric layer 13 exposing a portion of the soldering pad 12 may be formed on the first metal interconnect structure 11. The soldering pad 12 may electrically connect the first metal interconnect structure 11 with other devices and/or structures, thus the electrical signals of the devices formed in the semiconductor substrate 1 may be connected with other devices and/or structures through the first metal interconnect structure 11 and the soldering pad 12.

The soldering pad 12 may be made of any appropriate material, such as Cu, Au, or Al, etc. Various processes may be used to form the soldering pad 12, such as a physical vapor deposition (PVD) process, a sputtering process, or an electroplating process, etc. The mask for forming the soldering pad 12 may be a photoresist mask, or a shadow mask, etc.

The dielectric layer 13 may have any appropriate functions. In one embodiment, the dielectric layer 13 may be a passive layer having the wafer-proof property and the anti-contamination property, etc. The dielectric layer 13 may be made of any appropriate material, such as silicon oxide, silicon nitride, or silicon oxynitride, etc. In one embodiment, the dielectric layer 13 is made of silicon nitride. Various processes may be used to form the dielectric layer 13, such as a chemical vapor deposition (CVD) process, a PVD process, a flowable CVD (FCVD) process, or an atomic layer deposition (ALD) process, etc.

An opening (not labeled) may be formed in the dielectric layer 13 to expose the portion of the soldering pad 12. The opening may be formed by a dry etching process, a wet etching process, or an ion beam etching process, etc.

Further, the surface of the portion of the dielectric layer 13 on the soldering pad 12 may be higher than the surface of the portion of the dielectric on the surface of the first metal interconnect structure 11. When the dielectric layer 13 is formed by a CVD process, or an FCVD process, the dielectric layer 13 may follow the contour of the soldering pad 12, thus the protruding portion of the dielectric layer 13 may be formed.

Returning to FIG. 7, after forming the dielectric layer 13, a photoresist layer having an opening may be formed on the dielectric layer 13 (S102). FIG. 2 illustrates a corresponding structure.

As shown in FIG. 2, a photoresist layer 14 having an opening 15 is formed on the surface of the dielectric layer 13; and the opening 15 may expose a portion of the soldering pad 12 and a portion of the dielectric layer 13. Further, an undercut 16 may be formed at the portion of the photoresist layer 14 connecting with the bottom of the opening 15. The total area of the top surface of the protruding portion of the dielectric layer 13 and the surface of the soldering pad 12 exposed by the dielectric layer 13 may be equal to the bottom area of the undercut 16. Thus, the bottom area of the undercut 16 may be greater than the top area of the undercut 16. Therefore, the opening 15 and the undercut 16 may be used to subsequently form a pillar bump structure with an enlarged bottom area.

The opening 15 with the undercut 16 may be formed by any appropriate process. In one embodiment, a process for forming the opening 15 with the undercut 16 may includes sequentially spin-coating a photoresist on the surface of the semiconductor substrate 1; baking the photoresist; exposing the baked photoresist with a mask having the pattern of the opening 15; and developing the exposed photoresist.

Specifically, the baking temperature may be approximately 10° C.~50° C. lower than a normal baking temperature. As used herein, the normal baking temperature may refer to a baking temperature range generally used for baking the photoresist without the undercut. The normal baking temperature may be in a range of approximately 85° C.~140° C. Thus, the baking temperature to form the undercut 16 may be in a range of approximately 35° C.~130° C. The lower baking temperature may cause the baked photoresist layer 14 to have a smaller hardness. Further, the developing time of the exposed and baked photoresist may be approximately 1.2 times~2 times of a normal developing time. As used herein, the normal developing time may refer to a developing time range generally used for developing the photoresist without the undercut. The normal developing time may be in a range of approximately 40 s~30 min, thus the developing time to form the undercut 16 may be in a range of approximately 48 s~60 min; and the exposed photoresist may be overexposed. Therefore, with the lower baking temperature and the longer developing time, the undercut 16 may be formed in the photoresist at the bottom of the opening 15. The undercut 16 may cause the bottom area of the opening 15 to be greater than the top area of the opening 15.

Returning to FIG. 7, after forming the photoresist layer 14 with the opening 15, a metal pillar bump structure may be formed (S103). FIG. 3 illustrates a corresponding structure.

As shown in FIG. 3, a metal pillar bump structure 17 is formed in the opening 15. The metal pillar bump structure 17 may include a pillar body 171 formed in the opening 15 and an extension part 172 formed in the undercut 16.

Referring to FIG. 2 and FIG. 3, the undercut 16 formed in the photoresist layer 14 at the bottom of the opening 15 may aid to form the extension part 172 of the metal pillar bump structure 17. The bottom area of the extension part 172 may be greater than the cross-section area of the pillar body 171 of the metal pillar bump structure 17. The bottom area may refer to the contact area of the extension part 172 of the metal pillar bump structure 17 with the dielectric layer 13 and the soldering pad 12 exposed by the dielectric layer 13. Such an enlarged contact area may reduce the stress per unit area of the metal pillar bump structure 17, thus the breaking of the dielectric layer 13 on the semiconductor substrate 1 may be avoided; and the yield of the chip packaging structures may be improved. Further, forming the opening 15 in the photoresist layer 14 may be a standard process for forming metal pillars, thus the disclosed method may be able to improve the yield of the chip packaging structures with a relatively low cost.

In one embodiment, referring to FIG. 3, the extension part 172 of the metal pillar bump structure 17 may have a triangle shape. In certain other embodiment, the shape of the extension part 172 may be designed and controlled according to the failure mode of the chip packaging structure.

The metal pillar bump structure 17 may be made of any appropriate material, such as a Cu, Al, or Au, etc. In one embodiment, the metal pillar bump structure 17 is made of Cu.

Various processes may be used to form the metal pillar bump structure 17, such as a PVD process, an FCVD process, or an electroplating process, etc. In one embodiment, the metal pillar bump structure 17 is formed by an electroplating process.

Returning to FIG. 7, after forming the metal pillar bump structure 17, a soldering ball may be formed (104). The corresponding structure is illustrated in FIG. 3.

As shown in FIG. 3, the photoresist layer 14 is removed; and a soldering ball 18 is formed on the top of the metal pillar bump structure 17. The photoresist layer 14 may be removed by any appropriate process, such as a dry etching process, a wet etching process, or a plasma ashing process, etc. The soldering ball 18 may be formed by a standard soldering process.

Thus, a metal pillar bump packaging structure may be formed by the above disclosed processes methods; and a corresponding metal pillar bump packaging structure is illustrated in FIG. 3. As shown in FIG. 3, the metal pillar bump packaging structure includes a semiconductor substrate 1 and a plurality of devices (not shown) formed in the semiconductor substrate 1. The metal pillar bump packaging structure also includes a first metal interconnect structure 11 formed on the semiconductor substrate 1 and a soldering pad 12 formed on the first metal interconnect structure 11. Further, the metal pillar bump packaging structure includes a dielectric layer exposing a portion of the soldering pad 12 formed on the semiconductor substrate 1. Further, the metal pillar bump packaging structure also includes a metal pillar bump structure 17 having a pillar body 171 and an extension part 172 with an enlarged bottom area formed on the soldering pad 12; and a soldering ball 18 formed on the top of the metal pillar bump structure 17.

Figure 4:
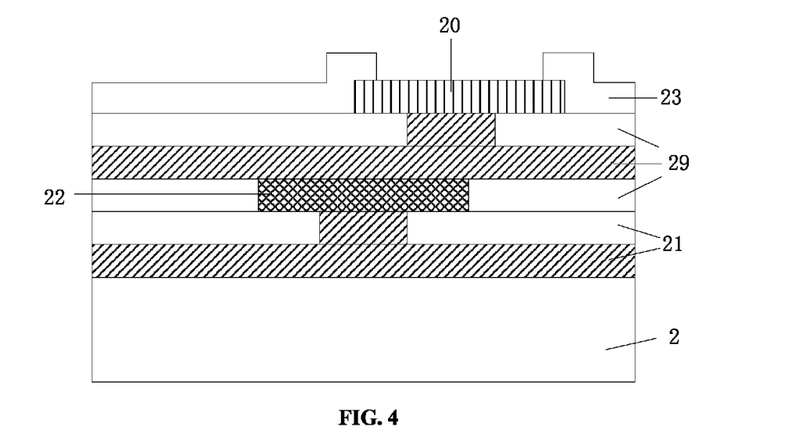
FIGS. 4~5 illustrate structures corresponding to certain stages of an exemplary fabrication process of another metal pillar bump structure consistent with the disclosed embodiments.
Figure 5:
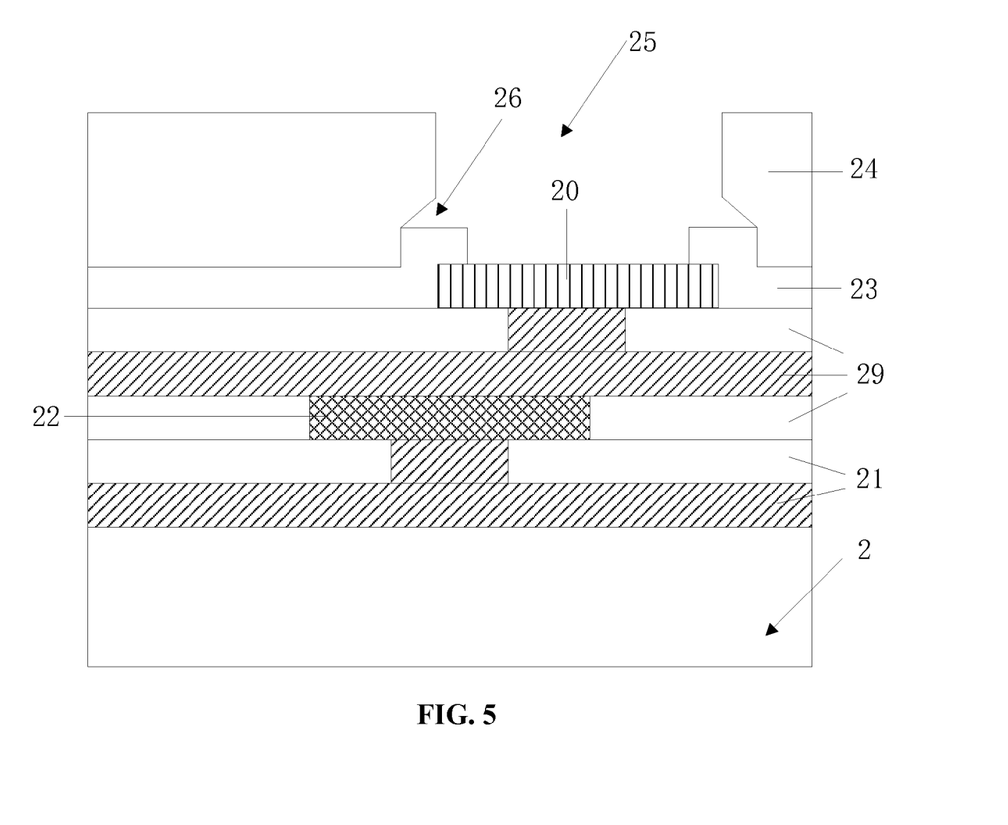
Figure 6:
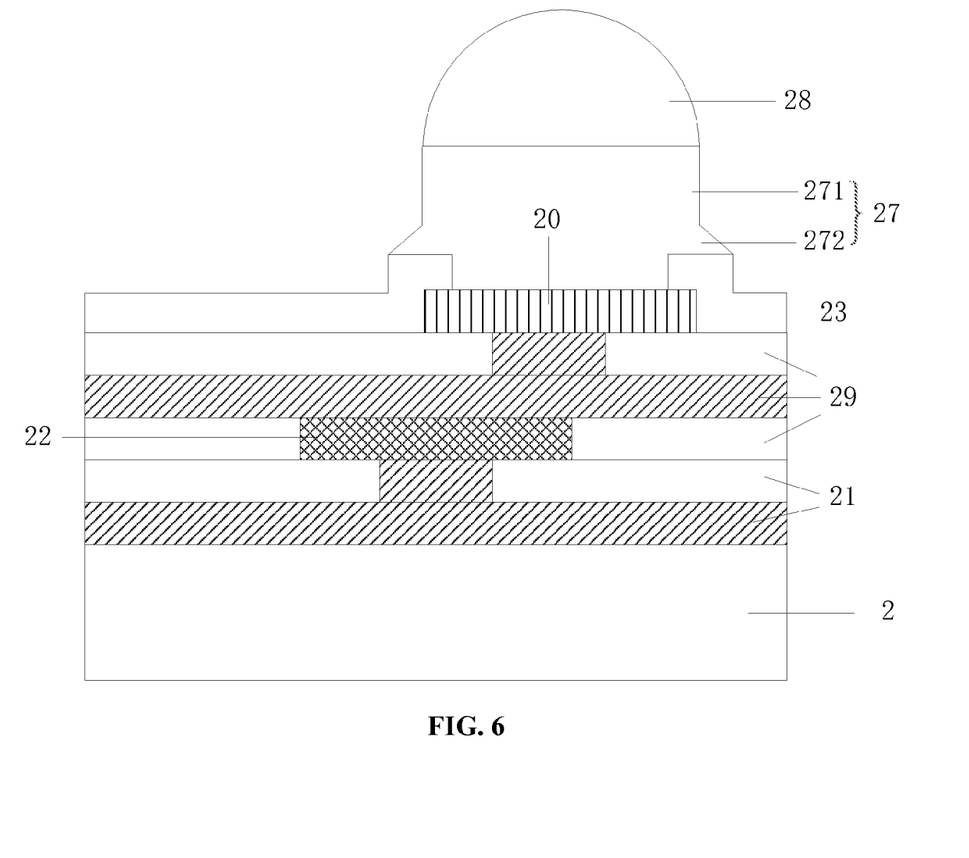
FIG. 6 illustrates another metal pillar bump packaging structure consistent with the disclosed embodiments.
Figure 8:
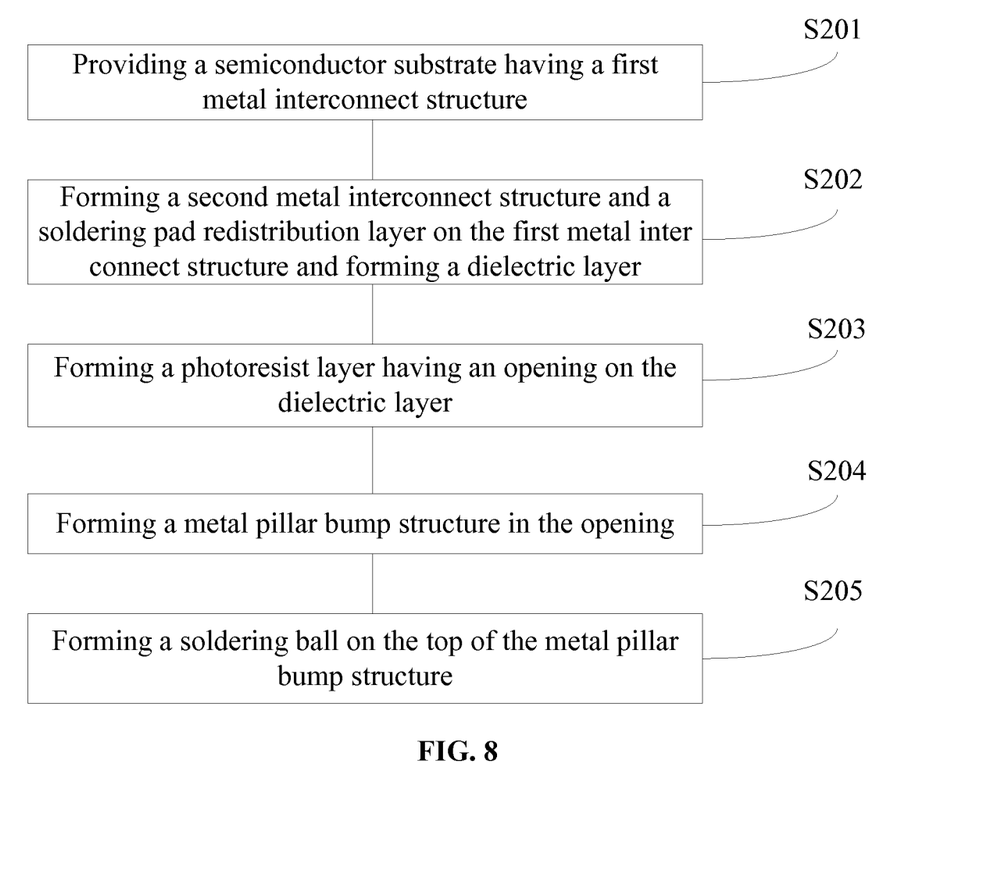
FIG. 8 illustrates an exemplary fabrication process of another metal pillar bump packaging structure.

FIG. 8 illustrates an exemplary fabrication process of another metal pillar bump packaging structure; and FIGS. 4~6 illustrate structures corresponding to certain stages of the exemplary fabrication process of another metal pillar bump packaging structure.

As shown in FIG. 8, at the beginning of the fabrication process, a semiconductor substrate with certain structures is provided (S201). FIG. 4 illustrates a corresponding structure.

As shown in FIG. 4, a semiconductor substrate 2 is provided. The semiconductor substrate 2 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. The substrate 2 provides a base for subsequent processes and structures Various devices (not shown) may be formed in and/or on the semiconductor substrate 2, such as transistors, MEMS devices, or resistors, etc. In one embodiment, the devices are transistors.

Further, a first metal interconnect structure 21 may be formed on the surface of semiconductor substrate 2. The first metal interconnect structure 21 may be configured to electrically connect the devices formed in and/or on the semiconductor substrate 2 with other devices and/or structures. The first metal interconnect structure 21 may be formed by any appropriate process.

Further, as shown in FIG. 4, a soldering pad 22 may be formed on the first metal interconnect structure 21. The soldering pad 22 may electrically connect the first metal interconnect structure 21 with other devices and/or structures, thus the electrical signals of the devices formed in the semiconductor substrate 2 may connect with other devices and/or structures through the first metal interconnect structure 21 and the soldering pad 22.

The soldering pad 22 may be made of any appropriate material, such as Cu, Au, or Al, etc. Various processes may be used to form the soldering pad 22, such as a physical vapor deposition (PVD) process, a sputtering process, or an electroplating process, etc. The mask for forming the soldering pad 22 may be a photoresist mask, or a shadow mask, etc.

In certain other embodiments, the soldering pad 22 may be other type of contacting pad. The contacting pad may be used to connect the first metal interconnect structure 21 with other devices and/or structures.

Returning to FIG. 8, after forming the soldering pad 22, a second metal interconnect structure and a soldering pad re-distribution layer may be formed (S202). A corresponding structure is illustrated in FIG. 4.

As shown in FIG. 4, a second metal interconnect structure 29 is formed on the surface of the first metal interconnect structure 21; and a soldering pad re-distribution layer 20 is formed on the second metal interconnect layer 29. The soldering pad re-distribution layer 20 may electrically connect with the second metal interconnect structure 29; and the second metal interconnect structure 29 may electrically connect with the soldering pad 22; thus the soldering pad re-distribution layer 20 may electrically connect with the first metal interconnect structure 21 and the devices and/or structures formed in the semiconductor substrate 2. The soldering pad redistribution layer 20 may be configured to re-distribute the position of the soldering pad 22. That is, the distance of adjacent soldering pads 22 may be re-arranged according to certain design requirements by using the soldering pad re-distribution layer 20. Thus, the device density on a wafer may be further increased.

Further, a dielectric layer 23 exposing a portion of the soldering pad re-distribution layer 20 may be formed on the second metal interconnect structure 29. The other portion of the soldering pad re-distribution layer 20 may be embedded in the dielectric layer 23. The dielectric layer 23 may have any appropriate functions. In one embodiment, the dielectric layer 23 may be a passive layer having a wafer-proof property and/or an anti-contamination property, etc. In certain other embodiments, the dielectric layer 23 may be an interlayer dielectric layer configured to electrically isolate the second metal interconnect structure 29 with other devices and/or structures.

The dielectric layer 23 may be made of any appropriate material, such as silicon oxide, silicon nitride, or silicon oxynitride, etc. In one embodiment, the dielectric layer 23 is made of silicon nitride. Various processes may be used to form the dielectric layer 23, such as a CVD process, a PVD process, an FCVD process, or an ALD process, etc.

An opening (not labeled) may be formed in the dielectric layer 23 to expose the portion of the soldering pad re-distribution layer 20. The opening may be formed by a dry etching process, a wet etching process, or an ion beam etching process, etc.

Further, the surface of the portion of the dielectric layer 23 on the soldering pad re-distribution layer 20 may be higher than the surface of the portion of the dielectric on the surface of the second metal interconnect structure 29. When the dielectric layer 23 is formed by a CVD process, or an FCVD process, the dielectric layer 23 may follow the contour of the soldering pad redistribution layer 20, thus the protruding portion of the dielectric layer 23 may be formed.

Returning to FIG. 8, after forming the dielectric layer 23, a photoresist layer having an opening may be formed on the dielectric layer 23 (S203). FIG. 5 illustrates a corresponding structure.

As shown in FIG. 5, a photoresist layer 24 having an opening 25 is formed on the surface of the dielectric layer 23; and the opening 25 may expose the portion of the soldering pad re-distribution layer 20 and a portion of the dielectric layer 23. Further, an undercut 26 may be formed at the portion of the photoresist layer 14 connecting with the bottom of the opening 25. The total area of the top surface of the protruding portion of the dielectric layer 13 and the surface of the soldering pad redistribution layer 20 exposed by the dielectric layer 13 may be equal to the bottom area of the undercut 26. Thus, the bottom area of the undercut 26 may be greater the top area of the undercut 26. Therefore, the opening 25 and the undercut 26 may be used to subsequently form a pillar bump structure with an enlarged bottom area.

The opening 25 with the undercut 26 may be formed by any appropriate process. In one embodiment, a process for forming the opening 25 with the undercut 26 may includes sequentially spin-coating a photoresist layer on the surface of the semiconductor substrate 2; baking the photoresist; exposing the baked photoresist with a mask having the pattern of the opening 25; and developing the exposed photoresist layer.

Specifically, the baking temperature may be approximately 10° C.~50° C. lower than a normal baking temperature. The normal baking temperature may be in a range of approximately 85° C.~140° C., thus the baking temperature to form the undercut 26 may be in a range of approximately 35° C.~130° C. The lower baking temperature may cause the baked photoresist to have a smaller hardness. Further, the developing time of the exposed and baked photoresist may be approximately 1.2 times~2 times of a normal developing time. The normal developing time may be in a range of approximately 40 s~30 min, thus the developing time to form the undercut 26 may be in a range of approximately 48 s~60 min; and the exposed photoresist may be overexposed. Therefore, with the lower baking temperature and the longer developing time, the undercut 26 may be formed in the photoresist at the bottom of the opening 25. The undercut 26 may cause the bottom area of the opening 25 to be greater than the top area of the opening 25.

Returning to FIG. 8, after forming the photoresist layer 24 with the opening 25, a metal pillar bump structure may be formed (S204). FIG. 6 illustrates a corresponding structure.

As shown in FIG. 6, a metal pillar bump structure 27 is formed in the opening 25. The metal pillar bump 27 may include a pillar body 271 formed in the opening 25 and an extension part 272 formed in the undercut 26.

Referring to FIG. 4 and FIG. 5, the undercut 26 formed in the photoresist layer 24 at the bottom of the opening 25 may aid to form the extension part 272 of the metal pillar bump structure 27. The bottom area of the extension part 272 may be greater than the cross-section area of the pillar body 271 of the metal pillar bump structure 27. The bottom area may refer to the contact area of the extension part 272 of the metal pillar bump structure 27 with the dielectric layer 23 and the soldering pad re-distribution layer 20 exposed by the dielectric layer 23. Such an enlarged contact area may reduce the stress per unit area of the metal pillar bump structure 27, thus the breaking of the dielectric layer 23 on the second metal interconnect structure 29 may be avoided; and the yield of the metal pillar bump packaging structures may be improved. Further, forming the opening 25 in the photoresist layer 24 may be a standard process for forming metal pillar bump structures, thus the disclosed method may be able to improve the yield of the metal pillar bump packaging structures with a relatively low cost.

In one embodiment, referring to FIG. 6, the extension part 272 of the metal pillar bump structure 27 may have a triangle shape. In certain other embodiments, the shape of the extension part 272 may be designed and controlled according to the failure mode of the metal pillar bump packaging structure.

The metal pillar bump structure 27 may be made of any appropriate material, such as a Cu, Al, or Au, etc. In one embodiment, the metal pillar bump structure 27 is made of Cu.

Various processes may be used to form the metal pillar bump structure 27, such as a PVD process, an FCVD process, or an electroplating process, etc. In one embodiment, the metal pillar bump structure 27 is formed by an electroplating process.

Returning to FIG. 8, after forming the metal pillar bump structure 27, a soldering ball may be formed (205). The corresponding structure is illustrated in FIG. 6.

As shown in FIG. 6, the photoresist layer 24 is removed; and a soldering ball 28 is formed on the top of the metal pillar bump structure 27. The photoresist layer 24 may be removed by any appropriate process, such as a dry etching process, a wet etching process, or a plasma ashing process, etc. In one embodiment, the photoresist layer 24 is removed by a plasma ashing process. The soldering ball 28 may be formed by a standard soldering process.

Thus, a metal pillar bump packaging structure may be formed by the above disclosed processes and methods; and FIG. 6 illustrates a corresponding metal pillar bump packaging structure. As shown in FIG. 6, the metal pillar bump packaging structure includes a semiconductor substrate 2 and a plurality of devices (not shown) formed in the semiconductor substrate 2. The metal pillar bump packaging structure also includes a first metal interconnect structure 21 formed on the surface of the semiconductor substrate 2 and a soldering pad 22 formed on the first metal interconnect structure 21. Further, the metal pillar bump packaging structure includes a second metal interconnect structure 29 formed on the first metal interconnect structure 21 and a soldering pad re-distribution layer 20 formed on the second metal interconnect structure 29. Further, the metal pillar bump packaging structure also includes a dielectric layer 23 exposing a portion of the soldering pad re-distribution layer 20 formed on the second metal interconnect structure 29, a metal pillar bump structure 27 having a pillar body 271 and an extension part 272 with an enlarged bottom area formed on the soldering pad re-distribution layer 20 and a soldering ball 28 formed on the top of the metal pillar bump structure 27.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a metal pillar bump packaging structure, comprising:
   providing a semiconductor substrate;
   forming a metal interconnect structure and a dielectric layer exposing a portion of the metal interconnect structure on the semiconductor substrate;

forming a photoresist layer having an opening with an undercut at a bottom of the opening to expose the portion of the metal interconnect structure and to expose a first portion of the dielectric layer that is on the metal interconnect structure and at the undercut;

forming a metal pillar bump structure having a pillar body and an extension part with an enlarged bottom area in the opening and the undercut, wherein the extension part with the enlarged bottom area is formed on the exposed portion of the metal interconnect structure and on the first portion of the dielectric layer that is on the metal interconnect structure and at the undercut; and forming a soldering ball on the metal pillar bump structure.

2. The method according to claim 1, wherein:
the metal interconnect structure is a soldering pad or a soldering pad re-distribution layer.

3. The method according to claim 1, wherein:
the metal pillar bump structure is made of Cu; and
the metal pillar bump structure is formed by an electroplating process.

4. The method according to claim 1, wherein forming the photoresist layer with an undercut further includes:
spin-coating a photoresist layer on the semiconductor substrate;
baking the coated photoresist layer formed on the semiconductor substrate;
exposing the baked photoresist using a mask having a pattern of the opening; and
developing the exposed photoresist layer to form the undercut with a bottom area greater than a top area.

5. The method according to claim 4, wherein:
a temperature for baking the coated photoresist layer is approximately 10° C.-50° C. lower than a normal baking temperature, and
the normal baking temperature is in a range approximately 85° C.-140° C.

6. The method according to claim 4, wherein:
a time for developing the expose photoresist layer is approximately 1.2 times-2 times of a normal developing time, and
the normal developing time is in a range of approximately 40 s-30 min.

7. The method according to claim 1, before forming the soldering ball, further including:
removing the photoresist layer.

8. The method according to claim 7, wherein:
the photoresist layer is removed by a plasma ashing process.

9. The method according to claim 1, wherein:
the first portion of the dielectric layer is partially on the metal interconnect structure to define the exposed portion of the metal interconnect structure, and
the dielectric layer further includes a second portion on the semiconductor substrate.

10. A metal pillar bump packaging structure, comprising:
a semiconductor substrate;
a metal interconnect structure formed on the semiconductor substrate;
a dielectric layer having a first portion on the metal interconnect structure to expose a portion of the metal interconnect structure formed on the semiconductor substrate;

a metal pillar bump structure having a pillar body and an extension part with an enlarged bottom area, wherein the extension part with the enlarged bottom area is on the exposed portion of the metal interconnect structure and on the first portion of the dielectric layer that is on the metal interconnect structure to enlarge the bottom area; and a soldering ball formed on the top of the metal pillar bump structure.

11. The metal pillar bump packaging structure according to claim 10, wherein the metal pillar bump structure is formed by:
forming a photoresist layer having an opening with an undercut at the bottom on the metal interconnect structure;
electroplating a metal material in the opening with the undercut; and
removing the photoresist layer.

12. The metal pillar bump packaging structure according to claim 10, wherein:
the metal pillar bump structure is made of Cu.

13. The metal pillar bump packaging structure according to claim 10, wherein:
the metal interconnect structure is a soldering pad or a soldering ball re-distribution layer.

14. The metal pillar bump packaging structure according to claim 10, wherein:
the dielectric layer is a passive layer.

15. The metal pillar bump packaging structure according to claim 14, wherein:
the dielectric layer is made of silicon nitride.

16. The metal pillar bump packaging structure according to claim 10, wherein:
the extension part of the metal pillar bump structure includes a triangle shape.

17. The metal pillar bump packaging structure according to claim 11, wherein the photoresist layer with the undercut is formed by:
spin-coating a photoresist layer on the semiconductor substrate;
baking the coated photoresist layer formed on the semiconductor substrate;
exposing the baked photoresist using a mask having a pattern of the opening; and
developing the exposed photoresist layer.

18. The metal pillar bump packaging structure according to claim 17, wherein the photoresist layer with the undercut is formed by:
a temperature for baking the coated photoresist layer is approximately 10° C.-50° C. lower than a normal baking temperature; and
a time for developing the exposed photoresist layer is approximately 1.2 times-2 times of a normal developing time.

19. The metal pillar bump packaging structure according to claim 10, wherein:
the first portion of the dielectric layer is partially on the metal interconnect structure to define the exposed portion of the metal interconnect structure, and
the dielectric layer further includes a second portion on the semiconductor substrate.

* * * * *